United States Patent
Groen et al.

(10) Patent No.: US 6,690,202 B1
(45) Date of Patent: Feb. 10, 2004

(54) CORRECTION OF DUTY-CYCLE DISTORTION IN COMMUNICATIONS AND OTHER CIRCUITS

(75) Inventors: Eric Douglas Groen, Ankeny, IA (US); Charles Walter Boecker, Ames, IA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/294,254

(22) Filed: Nov. 13, 2002

Related U.S. Application Data

(62) Division of application No. 09/968,471, filed on Sep. 28, 2001, now Pat. No. 6,507,220.

(51) Int. Cl.[7] .................................................. H03K 5/08
(52) U.S. Cl. .......................... 326/93; 326/82; 327/108; 327/309
(58) Field of Search ...................... 326/93, 82; 327/175, 327/291, 363, 108, 309

(56) References Cited

U.S. PATENT DOCUMENTS

| | | | |
|---|---|---|---|
| 3,859,624 A | * | 1/1975 | Kriofsky et al. .............. 340/38 |
| 4,906,871 A | * | 3/1990 | Iida ............................. 307/475 |
| 5,206,639 A | * | 4/1993 | Kamens ................. 340/825.54 |
| 5,477,180 A | | 12/1995 | Chen |
| 6,411,145 B1 | | 6/2002 | Kueng et al. |
| 6,522,323 B1 | * | 2/2003 | Sasaki et al. ................ 345/204 |

\* cited by examiner

Primary Examiner—Daniel Chang
(74) Attorney, Agent, or Firm—H. C. Chan; Justin Liu

(57) ABSTRACT

In some communications circuits a phenomenon called duty-cycle distortion—that is, a distortion of the apparent duration of the pulses in clock signals—causes the circuits to read clock signals as having a different duration than intended. Accordingly, the inventors devised unique circuitry for correcting or preventing this distortion. One exemplary circuit uses a voltage divider, comprising a pair of transistors, to set the DC or average voltage of the clock signals input to the digital circuit at a level approximating the logic threshold voltage of the digital circuit. In another example, a feedback circuit drives the DC or average voltage of signals input to the digital circuit to match a reference voltage that is substantially equal to the logic threshold voltage. In both examples, equating the DC or average voltage of the clock signals to the logic threshold voltage of the digital circuit reduces or prevents duty-cycle distortion.

10 Claims, 7 Drawing Sheets

CORRECTION OF DUTY-CYCLE DISTORTION IN COMMUNICATIONS AND OTHER CIRCUITS

TECHNICAL FIELD

The present invention concerns clock distribution circuits and techniques, particularly circuits and techniques related to communications circuits as well as processors and sequential logic circuits.

BACKGROUND

Electronic devices are typically coupled together to operate as systems that require the communication of data between two or more devices. Many of these devices includes a communications circuit, such as receiver, transmitter, or transceiver for this purpose.

A typical occurrence in these communication circuits is the transmission of a sequence of pulses, known as a clock, or timing, signal from an amplifier to a digital circuit, which relies on the clock signal for proper operation. Operation entails comparing the clock signal to a logic threshold voltage. If the comparison indicates that at a particular time the clock signal becomes greater than or less than the logic threshold voltage, the digital circuit initiates a particular action. However, if the digital circuit mis-perceives the clock signal, it may initiate the action too early or too late to achieve a desired effect. Thus, for proper operation, it is critical that the digital circuit accurately comprehends the clock signal.

One problem that the present inventors identified in some communications circuits concerns a phenomenon called duty-cycle distortion—that is, a distortion of the apparent magnitude (height) and/or duration (width) of the pulses in clock signals. For example, when using a high-speed amplifier to communicate a clock signal to a digital circuit in a receiver, the average (or DC) voltage of each clock signal deviates from the threshold voltage of the digital circuitry as intended, causing the digital circuit to read the clock signals as having a longer or shorter duration than intended. This ultimately causes the receiver to misinterpret some data signals received from a transmitter. (If the digital circuit is in a processor or sequential logic circuit other types of timing errors are likely to occur.)

One conventional solution to the duty-cycle distortion problem entails use of differential logic circuits. Differential logic circuits rely on voltage differences between pairs of clock signals, rather than the voltage level of a single clock signal, to ensure proper comprehension of clock signal levels and transitions. However, differential logic circuits are not only noisier, slower, and larger than single-ended logic circuits, but also less efficient.

Accordingly, the inventors have recognized a need for alternative solutions to the problem of duty-cycle distortion.

SUMMARY

To address these and other needs, the present inventors devised unique correction circuitry and related methodology for correcting duty-cycle distortion. In one exemplary embodiment, or implementation, the circuitry, which can be coupled between the output of an amplifier circuit and the input of a digital circuit, includes a pair of devices, such as a pair of resistors or a pair of field-effect transistors and a capacitor. One of the devices is coupled between a first power-supply node and the input of the digital circuit, and the other is coupled between a second power-supply node and the input of the digital circuit. The two devices act as a voltage divider, setting the DC or average voltage of signals input to the digital circuit at a level substantially matching the threshold voltage of the digital circuit, thereby reducing duty-cycle distortion. When the devices are field-effect transistors that share the same size ratio as transistors in the digital circuit, the correction circuitry reduces distortion despite not only temperature and power-supply variations, but also process variations that occur during fabrication.

In another implementation, the correction circuitry comprises a feedback circuit coupled between the output of the amplifier and the input of the digital circuit. The feedback circuit has a filter, a reference circuit, and a differential amplifier. The filter provides a filtered version of an amplifier output signal to one input of the differential amplifier, and the reference circuit provides a reference voltage, substantially equal to the threshold voltage of the digital circuit, to the other input of the differential amplifier. The differential amplifier ultimately sets the DC or average value of the input voltage to match the reference voltage, thereby reducing or correcting duty-cycle distortion.

One variant of this feedback implementation uses a voltage divider comprising two field-effect transistors that share the same size ratio as transistors in the digital circuit to develop the reference voltage. This arrangement allows the feedback circuit to precisely correct duty-cycle distortion despite not only temperature and power-supply variations that occur during operation, but also structural variations that occur during fabrication.

Other aspects of the invention include receivers, transmitters, and transceivers that incorporate the correction circuitry. Still other aspects include programmable integrated circuits and systems of electronic devices.

DETAILED DESCRIPTION OF EXEMPLARY EMBODIMENTS

The following detailed description, which references and incorporates the above-identified figures, describes and illustrates one or more specific embodiments of the invention. These embodiments, offered not to limit but only to exemplify and teach, are shown and described in sufficient detail to enable those skilled in the art to implement or practice the invention. Thus, where appropriate to avoid obscuring the invention, the description may omit certain information known to those of skill in the art.

Figure 1:
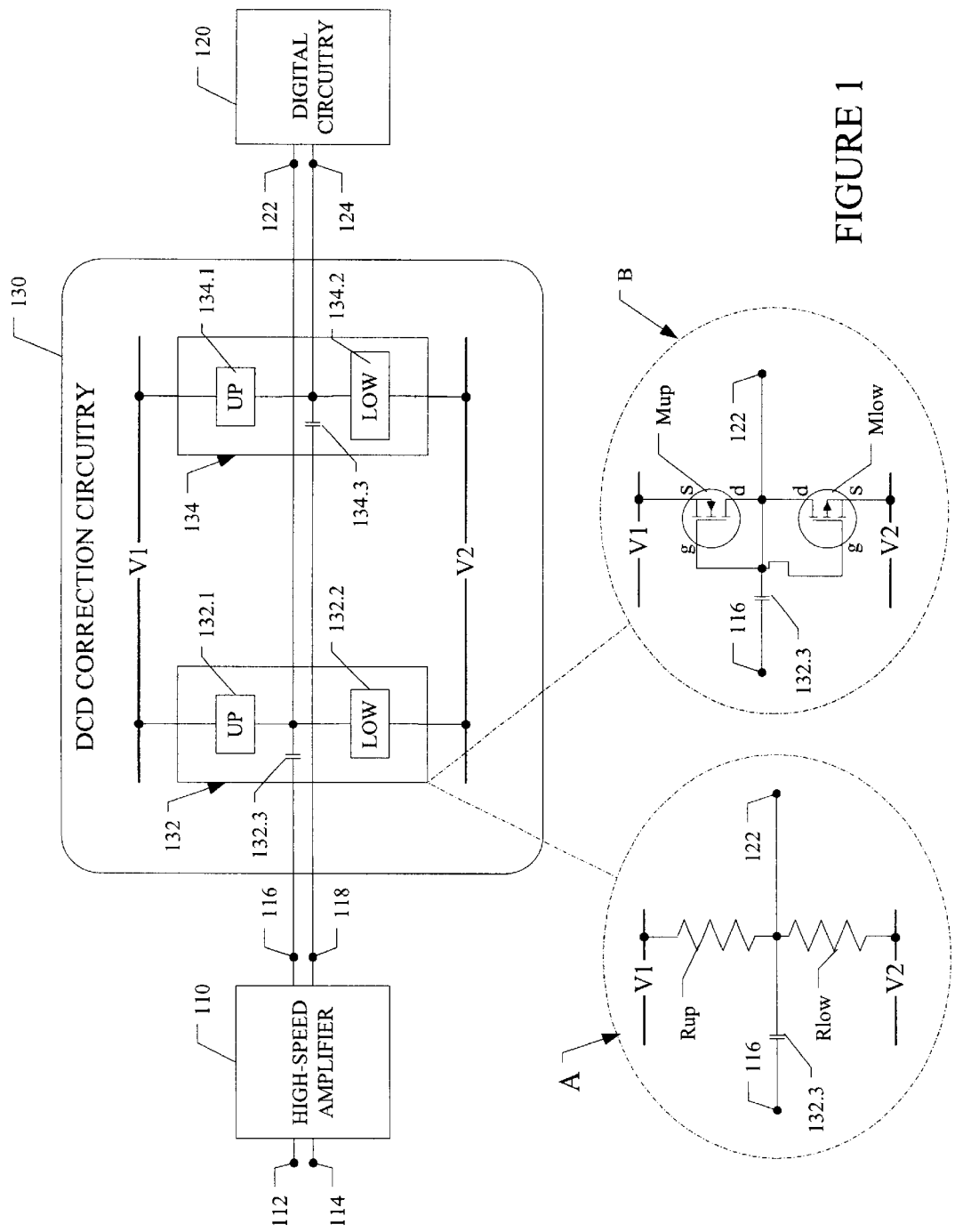
FIG. 1 is a block diagram of an exemplary system 100 incorporating teachings of the present invention.

FIG. 1 shows an exemplary system 100 incorporating teachings of the present invention. System 100 includes a high-speed differential amplifier 110, digital circuitry 120, and duty-cycle-distortion (DCD) correction circuitry 130.

Amplifier 110, which can assume any form, has differential or complementary inputs 112 and 114 and differential or complementary outputs 116 and 118. Inputs 112 and 114 receive differential or complementary inputs signals from other circuitry (not shown), and outputs 116 and 118 output differential or complementary output signals to inputs 122 and 124 of digital circuitry 120.

DCD correction circuit 130 includes respective upper and lower supply nodes (or terminals) V1 and V2 and correction circuits 132 and 134 for correcting duty-cycle distortion at respective inputs 122 and 124. (To conserve power, some embodiments include enablement circuitry to disable DCD correction circuit 130 when the entire system is shut down.) Correction circuit 132 includes respective upper and lower subcircuits 132.1 and 132.2 and coupling capacitor 132.3. And, correction circuit 134, which is substantially identical to correction circuit 132, includes respective upper and lower subcircuits 134.1 and 134.2 and a coupling capacitor 134.3.

More specifically upper subcircuit 132.1 is coupled between upper supply node V1 and input 122 of digital circuitry 120. Lower subcircuit 132.2 is coupled between lower supply node V2 and input 122. Coupling capacitor 132.3 is coupled between output 116 and input 122.

FIG. 1 also shows exemplary versions A and B of subcircuit 132 (which are also applicable to subcircuit 134.) Version A implements upper and lower subcircuits 132.1 and 132.2 as respective pull-up and pull-down resistors Rup and Rlow. Resistors Rup and Rlow are nominally equal in resistance and thus set the DC voltage at input 120 to a nominal voltage midway between the voltages at supply nodes V1 and V2. However, the value of resistors Rup and Rlow can be varied to establish the DC voltage at input 120 to any desired level, limited only by the precision of the resistors and power-supply fluctuations.

Although version A corrects duty-cycle distortion, the degree of correction is limited since the DC voltage fixed by resistors Rup and Rlow may deviate from the actual threshold voltage of digital circuitry 120. Factors contributing to this deviation include variations in the resistors and the digital circuitry that occur during fabrication and variations in temperature that occur during operation. Version B addresses these factors to ensure more precise correction of duty-cycle distortion.

In particular, version B implements upper and lower subcircuits 132.1 and 132.2 as respective p- and n-type metal-oxide-semiconductor field-effect transistors (mosfets) Mup and Mlow. Transistors Mup and Mlow, like all other field-effect transistors in this description, have respective control gates, drains, and sources denoted respectively using g, d, and s in the figure. (In more generic transistor nomenclature, the gate corresponds to a control node, and the source and drain correspond to non-control nodes.) The gates and drains of transistors Mup and Mlow are coupled together, configuring the transistors to function as diodes.

In this embodiment, the size, that is, channel-length-to-width ratios of transistors Mup and Mlow (the pull-up and pull-down transistors) are sized in the same ratio as the n- and p-type transistors in digital circuitry 120. With integration of the correction circuitry and digital circuitry on the same chip, this arrangement shifts the DC voltage at input 122 in a manner that tracks not only process variations, but also temperature and power-related variations in the n- and p-type devices of the digital circuitry. Thus, version B generally provides more precise correction of duty-cycle distortion than version A.

Figure 2:
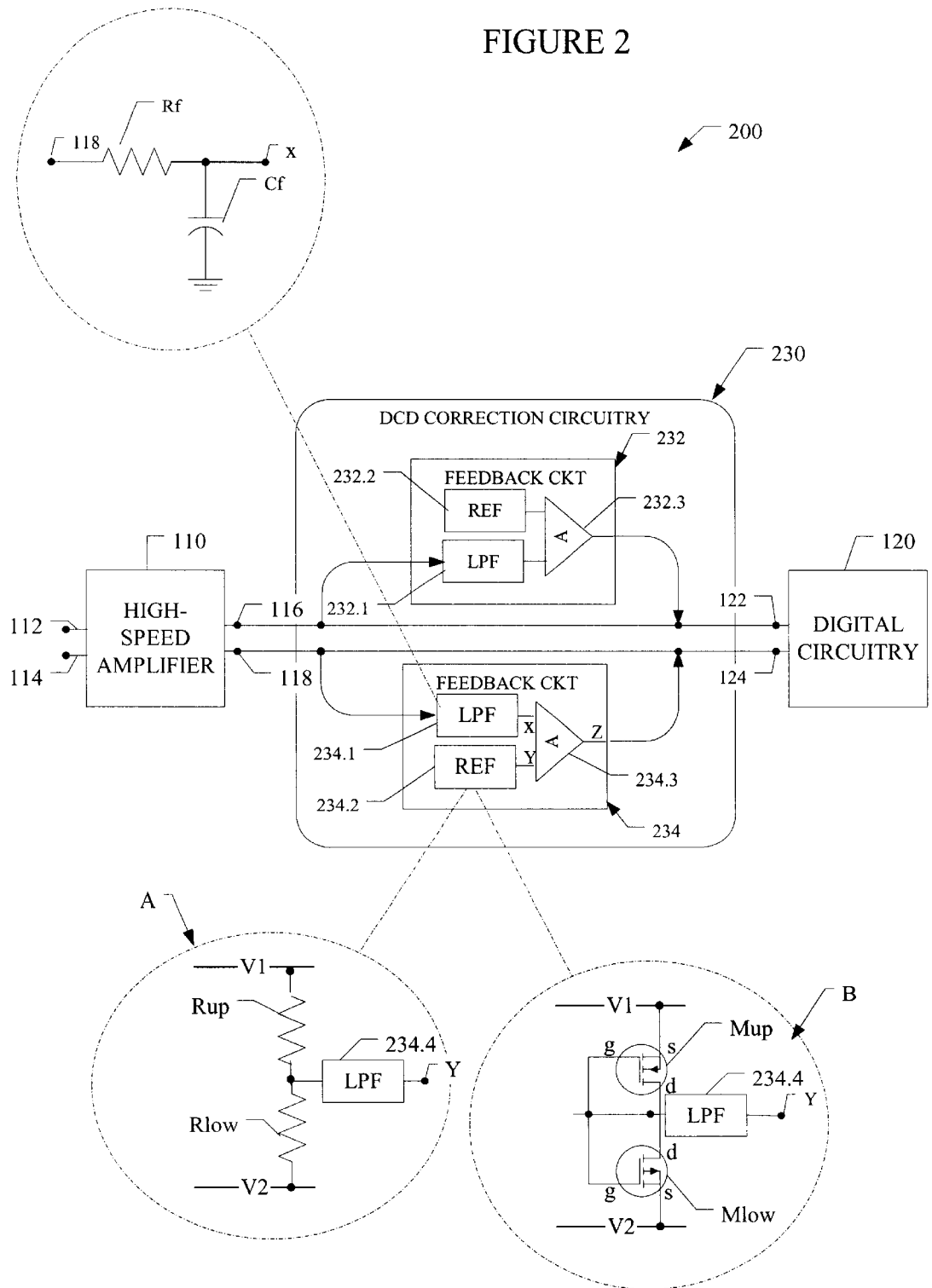
FIG. 2 is a block diagram of an exemplary system 200 also incorporating teachings of the present invention.

FIG. 2 shows an exemplary system 200 incorporating additional teachings of the present invention. System 200 includes differential amplifier 110 and digital circuitry 120 from system 100 and a duty-cycle-distortion (DCD) correction circuitry 230.

DCD correction circuit 230 includes respective feedback circuits 232 and 234 for correcting duty-cycle distortion at respective inputs 122 and 124 of digital circuitry 120. (To conserve power, some embodiments include enablement circuitry to disable DCD correction circuit 230 when the entire system is shut down.) Feedback circuit 232 includes low-pass filter (LPF) 232.1, reference circuit 232.2, and differential amplifier 232.3. And, feedback circuit 234, which is substantially identical to feedback circuit 232, includes low-pass filter 234.1, reference circuit 234.2, and differential amplifier 234.3. (The following description of feedback circuit 234 is also applicable to feedback circuit 232.)

Specifically, low-pass filter 234.1, which, for example, comprises resistor Rf and capacitor Cf, is coupled between output 118 of amplifier 110 and an input X of differential amplifier 234.3. (The invention is not limited to any particular form of filter; indeed, some embodiments implement filter 234.1 as a higher order digital filter or an analog low-pass or band-pass filter.) Amplifier 234.3 also has an input Y and an output Z which are coupled respectively to reference circuit 234.2 and input 124 of digital circuitry 120. (Other embodiments couple output Z to a point within amplifier 110, to input 114, or to a point prior to amplifier 110 that allows adjustment of the DC or average voltage of the signal presented to input 124 of digital circuitry 120.) Reference circuit 234.4 estimates the logic threshold voltage of digital circuitry 120.

FIG. 2 further shows exemplary versions A and B of reference circuit 234.2 (which are also applicable to reference circuit 232.2.) In addition to power-supply nodes V1 and V2, version A comprises respective pull-up and pull-down resistors Rup and Rlow and a low-pass filter 234.4. Resistors Rup and Rlow are nominally equal in resistance and provide a nominal input voltage to low-pass filter 234.4 which is midway between the voltages at supply nodes V1 and V2. However, the value of resistors Rup and Rlow can be varied to establish other desired input voltages to the filter. Low-pass filter 234.4, which can assume any number of analog or digital forms, filters the input voltage and provides a substantially constant reference voltage to input Y of differential amplifier 234.3.

In operation, version A of the reference circuit provides a reference voltage that ultimately determines how precisely lower feedback circuit 234 can correct for duty-cycle distortion. Specifically, low-pass filter 234.1 provides a sensed or measured DC voltage signal based on output 118 to differential amplifier 234.3. And, amplifier 234.3 provides a corrective voltage or current signal based on the difference of the sensed DC signal and a reference voltage from reference circuit to input 124 of digital circuitry 120. The corrective voltage or current signal alters the DC or average voltage at input 124 to a value substantially equal to the reference voltage. The reference voltage should be selected to match the threshold voltage of digital circuitry.

Version B of the reference circuit ultimately allows more precise correction of duty-cycle distortion. In particular, version B replaces resistors Rup and Rlow with respective p- and n-type mosfets Mup and Mlow. Transistors Mup and Mlow are configured to function as diodes. That is, the gate and drain of transistor Mup are coupled together, and the gate and drain of transistor Mlow are coupled together. In this example, the channel length-to-width ratios of transistors Mup and Mlow are sized in the same ratio as the - and p-type transistors in digital circuitry 120, enabling reference circuit 234.2 to provide a reference voltage that closely tracks the threshold voltage of digital circuitry 120 over process, temperature, and power-supply variations.

Exemplary Receiver

Figure 3:
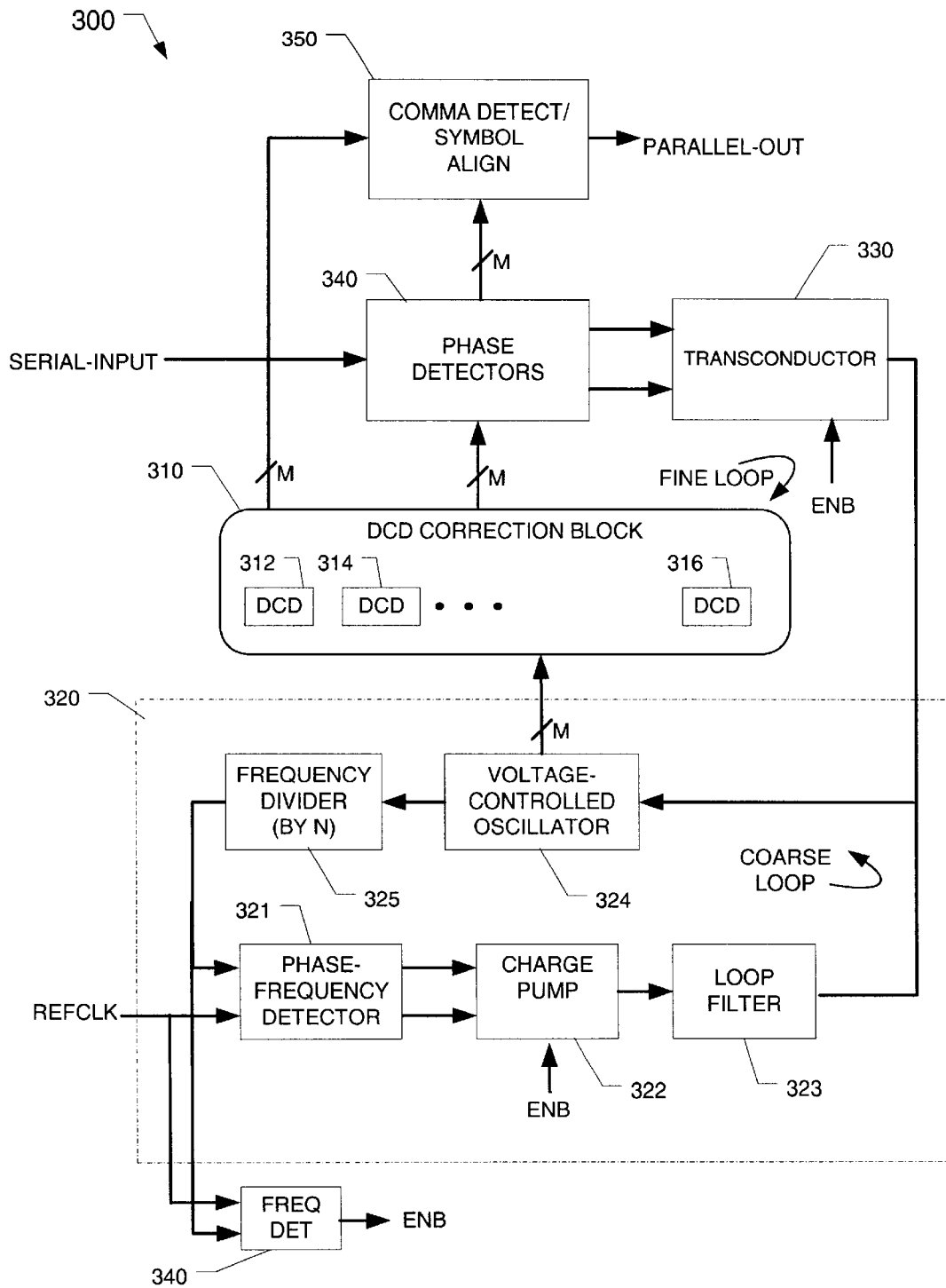
FIG. 3 is a block diagram of an exemplary receiver 300 incorporating teachings of the present invention.

FIG. 3 shows an exemplary receiver 300, which aside from the inclusion of a DCD correction block 310 based on the teachings of FIG. 1 and/or FIG. 2, operates according to known principles. More specifically, DCD correction block 310 includes M or 2*M separate DCD correction circuits, of which DCD correction circuits 312, 314, and 316 are representative. Each of the DCD correction circuits is patterned after circuit 132 in FIG. 1 or circuit 232 in FIG. 2.

In addition to DCD correction block 310, receiver 300 includes a coarse phase-locked loop 320, a transconductor 330, a frequency detector 340, a comma-detection-and-symbol-alignment block 350, a reference-clock input REFCLK, a serial-data input SERIAL-INPUT, and a parallel-data output PARALLEL-OUT. Phase-locked loop 320 includes a phase-frequency detector 321, a charge pump 322, a loop filter 323, a voltage-controlled oscillator 324, and a frequency divider 325.

Exemplary Transmitter

Figure 4:
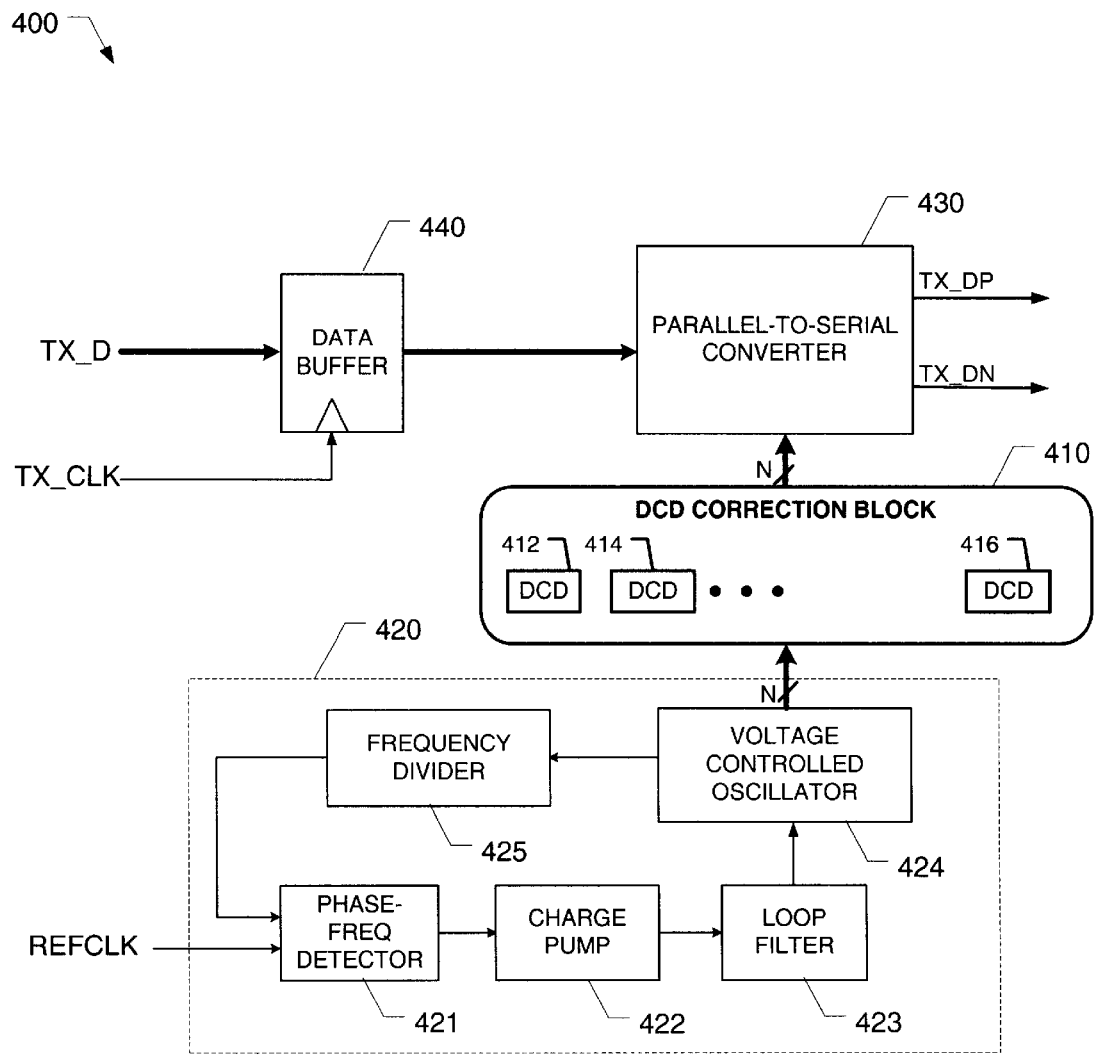
FIG. 4 is a block diagram of an exemplary transmitter 400 incorporating teachings of the present invention.

FIG. 4 shows an exemplary transmitter 400 which aside from the inclusion of a DCD correction block 410 based on the teachings of FIG. 1 and/or FIG. 2, operates according to known principles. More specifically, DCD correction block 410 includes N or 2*N separate DCD correction circuits, of which DCD correction circuits 412, 414, and 416 are representative. Each of the DCD correction circuits is patterned after circuit 132 in FIG. 1 or circuit 232 in FIG. 2.

Additionally, transmitter 400 includes a phase-locked loop 420, parallel-to-serial converter 430, data buffer 440, parallel data input TX_D, transmitter clock input TX_CLK, and reference-clock input REFCLK. Phase-locked loop 410, which receives a signal from reference-clock input REFCLK, includes a phase-frequency detector 411, a charge pump 412, a loop filter 413, a voltage-controlled oscillator 414, and a frequency divider 415.

Exemplary Field-Programmable Integrated Circuit

Figure 5:
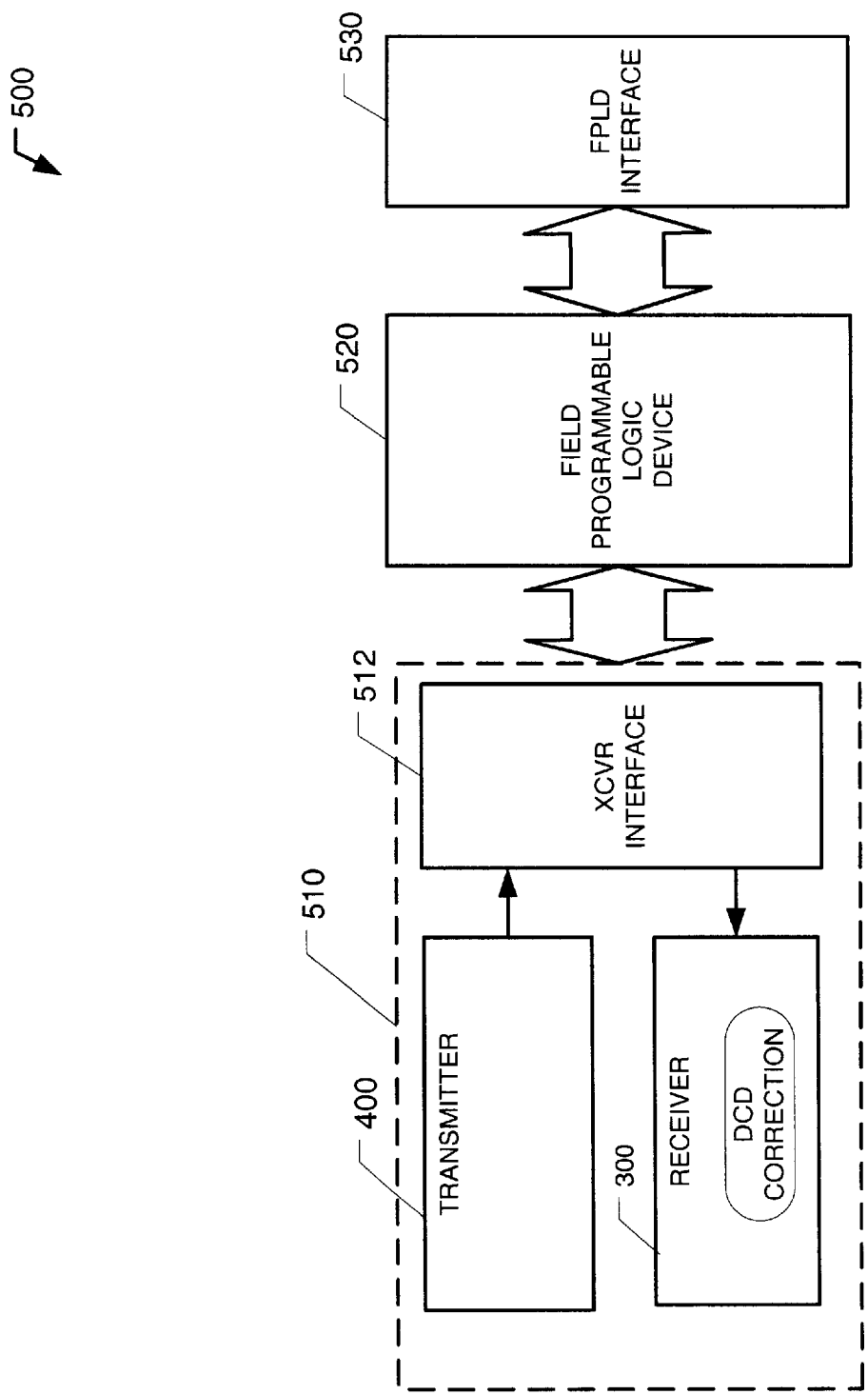
FIG. 5 is a block diagram of an exemplary programmable integrated circuit 500 incorporating the exemplary receiver of FIG. 3 and the exemplary transmitter of FIG. 4.

FIG. 5 shows a block diagram of an exemplary field-programmable integrated circuit 500, which includes a transceiver 510, a field-programmable logic device (FPLD) 520, such as a field-programmable gate array (FPGA), and a FPLD interface 530. Transceiver 510 includes exemplary receiver 300 (of FIG. 3), exemplary transmitter 400 (of FIG. 4), and transceiver (XCVR) interface 512. Although not shown for clarity of illustration, various embodiments of logic device 520 include one or more individually and collectively configurable logic blocks, as well as an on-board processor and memory, which facilitate configuration of the device to perform desirable signal and data-processing functions. FPLD Interface 530 provides conventional communications and program-support capabilities.

Exemplary Processor

Figure 6:
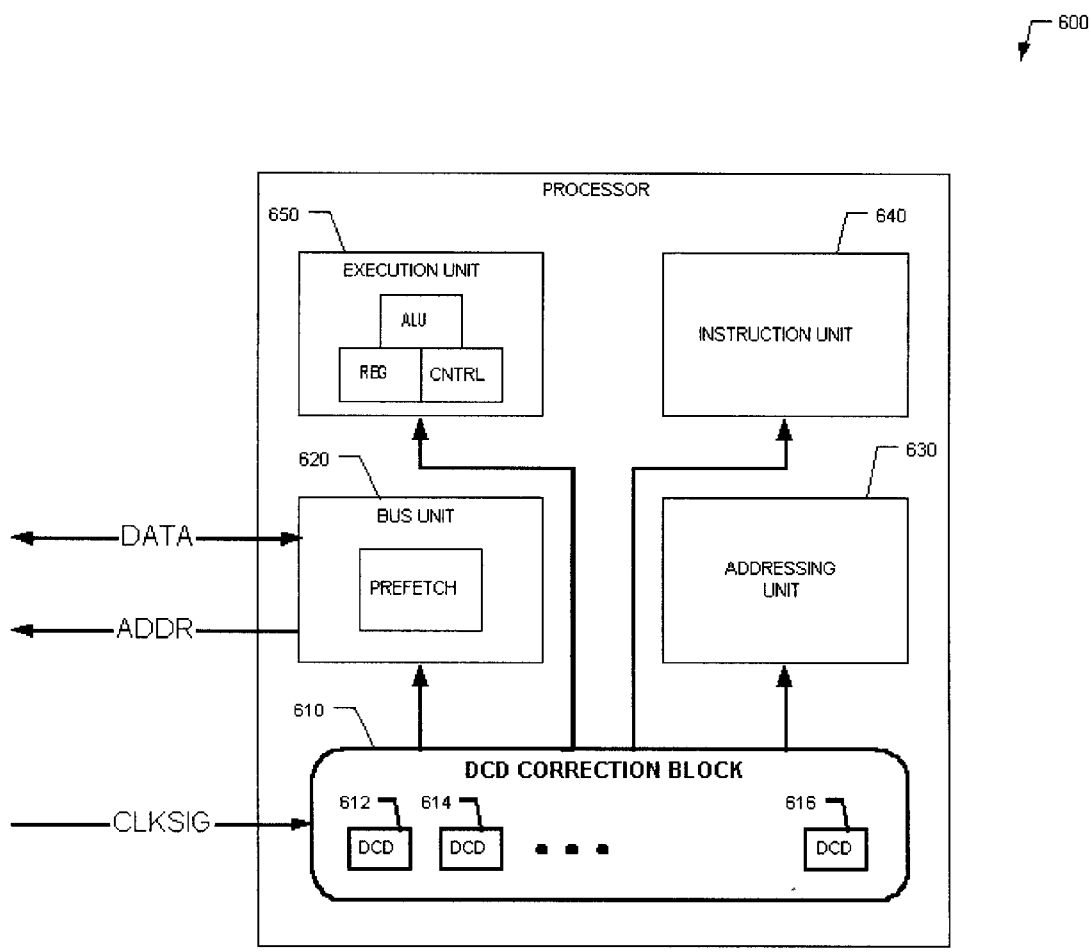
FIG. 6 is a block diagram of an exemplary processor 600 incorporating teachings of the present invention.

FIG. 6 shows an exemplary processor 600 which aside from the inclusion of a DCD correction block 610 based on the teachings of FIG. 1 and/or FIG. 2, operates according to known principles. More specifically, DCD correction block 610 includes a plurality of separate DCD correction circuits, of which DCD correction circuits 612, 614, and 616 are representative. Each of the DCD correction circuits, which is patterned after circuit 132 in FIG. 1 or circuit 232 in FIG. 2, distributes a corrected version of input clock signal CLKSIG to functional block of processor 600, such as a bus unit 620, an address unit 630, an instruction unit 640, and an execution unit 650. Bus unit 620 is coupled to memory block (not shown) via data bus DATA and address bus ADDR. The present invention is not limited to any particular processor architecture.

Exemplary Electronic System

Figure 7:
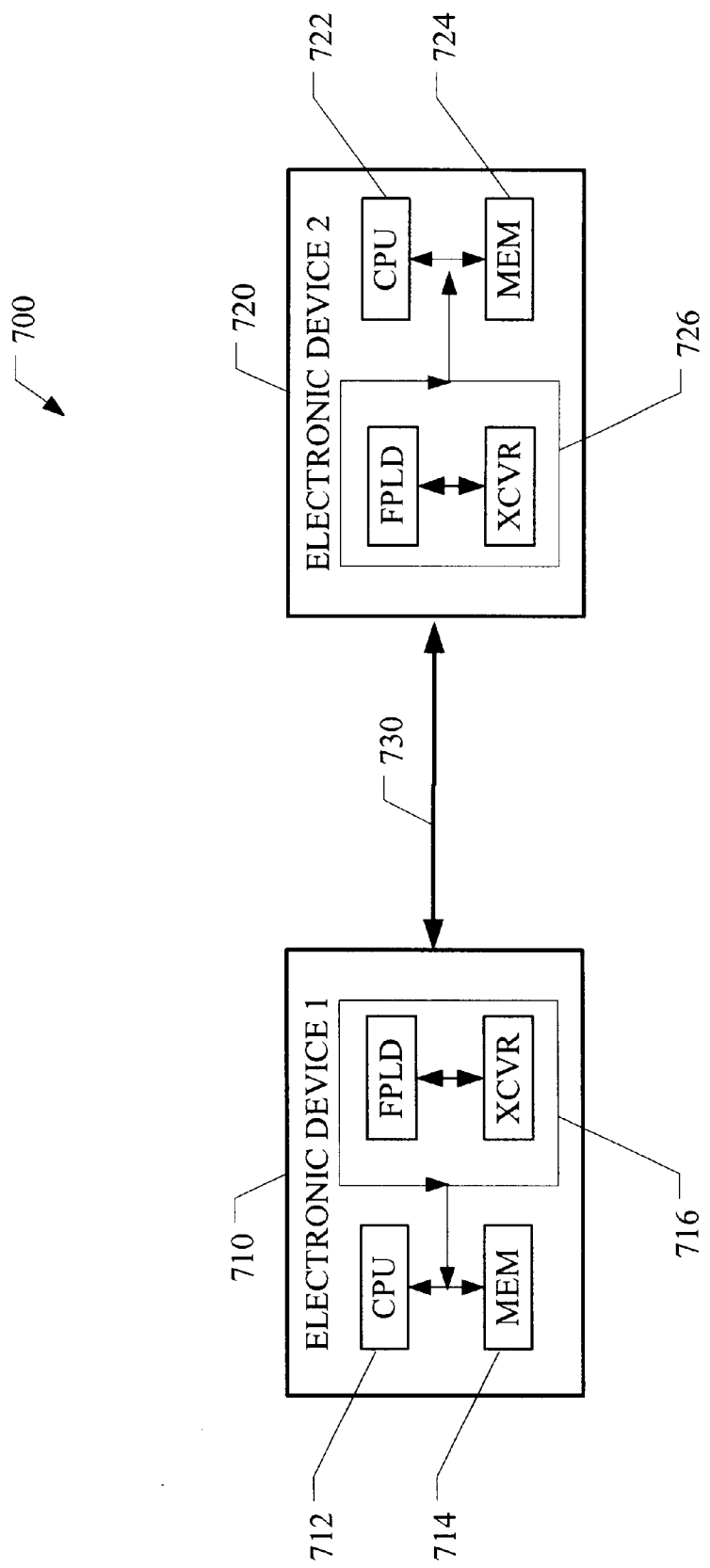
FIG. 7 is a block diagram of an exemplary system 700 incorporating the programmable integrated circuit of FIG. 5 and the processor of FIG. 6.

FIG. 7 shows an exemplary system 700 including two or more electronic devices that incorporate field-programmable integrated circuit 500 of FIG. 5 and processor 600 of FIG. 6. In particular, system 700 includes electronic devices 710 and 720 and a communications link 730. Devices 710 and 720 include respective processors 712 and 722, memories 714 and 724, and integrated programmable circuits 716 and 726. Processors 712 and 722 incorporate teachings of processor 600. Circuits 716 and 726 incorporate the teachings of integrated circuit 500 in FIG. 5 and thus provide devices 710 and 720 with capability for communicating over communications link 730 to each other (or to one or more other suitably equipped devices.) Communications link 730, which can be a wireline or wireless connection, carries voice, analog, and/or digital data, including programming commands and instructions.

Devices 710 and 720 can assume a wide variety of forms. For example, in various embodiments, one or both of the devices are a computer, monitor, mouse, key board, printer, scanner, fax machine, network communications device, personal digital assistant, cordless telephone, headset, mobile telephone, vehicle, appliance, entertainment equipment, and industrial controller. Indeed, virtually any device that currently communicates with another device wirelessly or via a wireline connection, that would be more useful with such communication, or that could benefit from better matching of clocks signals incorporate teachings of the present invention.

Conclusion

In furtherance of the art, the present inventors have presented unique correction circuitry for correcting duty-cycle distortion. In one exemplary embodiment includes a voltage divider, comprising a pair of resistors or pair of transistors, for setting the DC or average voltage of signals input to a digital circuit at a level substantially matching the threshold voltage of the digital circuit, thereby reducing duty-cycle distortion. In another embodiment, a feedback circuit drives the DC or average voltage of signals input to the digital circuit to match a reference voltage that is substantially equal to threshold voltage of the digital circuit, thereby reducing duty-cycle distortion. One variant of the feedback circuit uses a voltage divider comprising two field-effect transistors to develop the reference voltage. This arrangement allows the feedback circuit to precisely correct duty-cycle distortion despite process, temperature, and power-supply variations.

The embodiments described above are intended only to illustrate and teach one or more ways of practicing or implementing the present invention, not to restrict its breadth or scope. The actual scope of the invention, which embraces all ways of practicing or implementing the teachings of the invention, is defined only by the following claims and their equivalents.

What is claimed is:

1. A circuit comprising:

first and second supply nodes having first and second voltage levels, respectively;

an amplifier having first and second differential outputs for providing a clock signal;

a digital circuit having first and second differential inputs;

a first capacitor having first and second nodes, with the first node coupled to the first output of the amplifier and the second node coupled to the first input of the digital circuit;

a second capacitor having first and second nodes, with the first node coupled to the second output of the amplifier and the second node coupled to the second input of the digital circuit;

first and second subcircuits for setting a DC voltage at the first input of the digital circuit to a third voltage level that is between the first and second voltage levels;

wherein the first subcircuit is coupled between the second node of the first capacitor and the first supply node; and wherein the second subcircuit is coupled between the second node of the first capacitor and the second supply node; and third and fourth subcircuits for setting a DC voltage at the second input of the digital circuit to a fourth voltage level that is between the first and second voltage levels;

wherein the third subcircuit is coupled between the second node of the second capacitor and the first supply node; and wherein the fourth subcircuit is coupled between the second node of the second capacitor and the second supply node.

2. The circuit of claim 1, wherein the first, second, third and fourth subcircuits respectively comprise first, second, third and fourth resistors.

3. The circuit of claim 1, wherein the first, second, third and fourth subcircuits respectively comprise first, second, third and fourth diode-connected transistors.

4. The circuit of claim 3, wherein the digital circuit includes a plurality of n-type and p-type transistors that have a predetermined size ratio, and wherein the first, second, third and fourth diode-connected transistors have substantially the same predetermined size ratio.

5. The circuit of claim 4, wherein each of the transistors is a field-effect transistor.

6. A receiver comprising the circuit of claim 5, wherein the amplifier is a part of a phase-locked loop, and wherein the digital circuit has an input for receiving a data input.

7. A transmitter comprising the circuit of claim 5, wherein the amplifier is a part of a phase-locked loop, and wherein the digital circuit has an output for providing transmit data.

8. A processor comprising the circuit of claim 5, wherein the digital circuit consists of at least one of a bus unit, an address unit, an instruction unit, and an execution unit.

9. A programmable integrated circuit comprising the circuit of claim 5, further comprising at least one configurable logic block coupled to the digital circuit.

10. A system comprising first and second electronic devices with at least one of the devices comprising the programmable integrated circuit of claim 9.

* * * * *